United States Patent

Takahashi et al.

[11] Patent Number: 5,297,722
[45] Date of Patent: Mar. 29, 1994

[54] WIRE BONDING METHOD AND APPARATUS

[75] Inventors: Kuniyuki Takahashi; Nobuto Yamazaki, both of Tokyo, Japan

[73] Assignee: Kabushiki Kaisha Shinkawa, Tokyo, Japan

[21] Appl. No.: 92,032

[22] Filed: Jul. 15, 1993

Related U.S. Application Data

[63] Continuation of Ser. No. 869,633, Apr. 16, 1992, abandoned.

[30] Foreign Application Priority Data

Apr. 19, 1991 [JP] Japan .................................. 3-113826

[51] Int. Cl.⁵ .......................................... H01L 21/603
[52] U.S. Cl. .................................... 228/180.5; 228/4.5
[58] Field of Search ................................ 228/4.5, 179

[56] References Cited

U.S. PATENT DOCUMENTS 4,340,166 7/1982 Bilane et al. ........................ 228/4.5
5,058,797 10/1991 Terakado et al. ............... 228/179 X

FOREIGN PATENT DOCUMENTS 62-52948 11/1987 Japan ........................... H01L 21/60

*Primary Examiner*—Kenneth J. Ramsey
*Attorney, Agent, or Firm*—Koda and Androlia

[57] ABSTRACT

In a wire bonding apparatus and method which reduces variances of the length of tails of bonding wires without increasing the total wire cutting time, a capillary and a wire cutting clamp are moved up fast 10 and then slowly 11, after the wire is bonded to a second bonding point 1, to a-point slightly below a desired tail length S, and then the capillary and the clamp are moved up slowly 12 so that the clamp is closed to cut the wire and then moved up fast 13 and slowly 14 again.

3 Claims, 3 Drawing Sheets

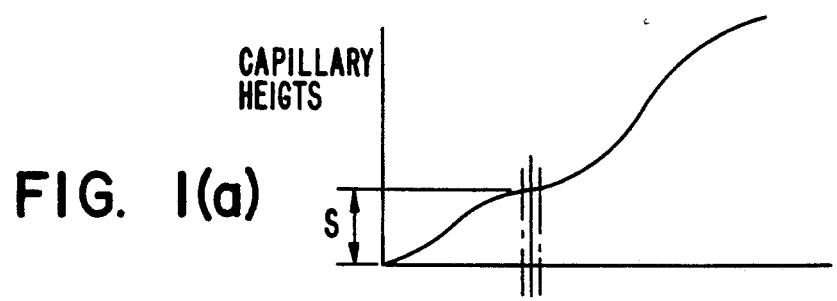
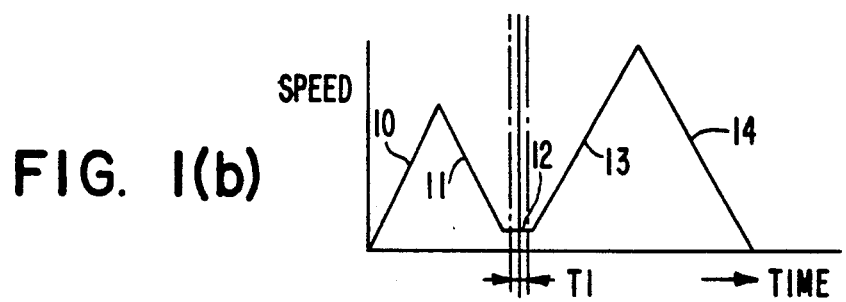
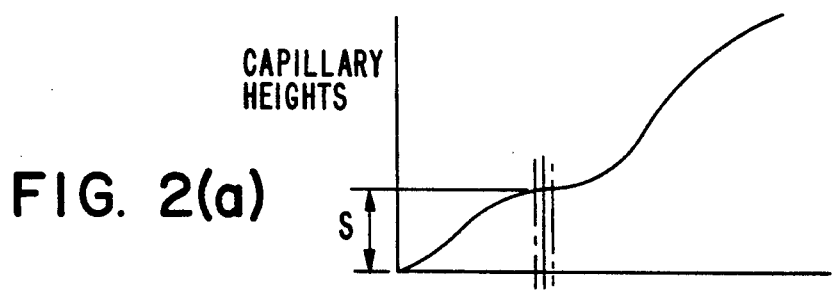
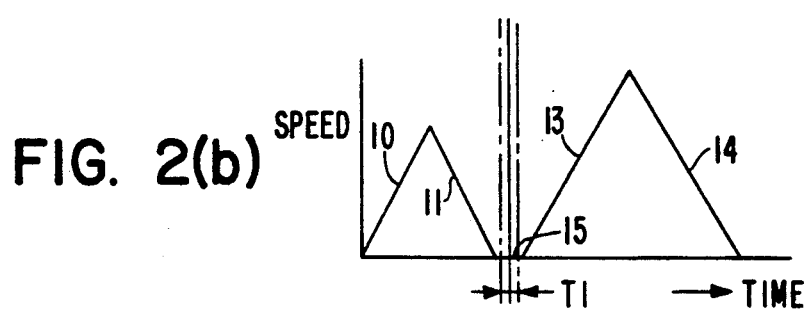

WIRE BONDING METHOD AND APPARATUS

This is a continuation of application Ser. No. 07/869,633, filed Apr. 16, 1992 now abandoned.

BACKGROUND OF THE INVENTION

1. Field of the Invention

The present invention relates to a wire bonding method and apparatus and more specifically to a method and apparatus for cutting a wire after a bonding is performed to a second bonding point.

2. Prior Art

FIG. 6 shows conventional wire bonding actions.

A capillary 3 and a wire cutting clamp 4 are moved up as shown in FIGS. 6(b) and 6(c) after a bonding wire 2 is bonded to a second bonding point 1 as shown in FIG. 6(a). In this case, the speed of the capillary 3 and wire cutting clamp 4 moving up is, as shown in FIG. 5(b), first increased as referred to by numeral 5 and then decreased as referred to by numeral 6.

While the moving up speed of the capillary 3 and wire cutting clamp 4 is accelerated at 5, the wire cutting clamp 4 is closed, thus cutting the wire from the attachment base of the second bonding point 1 as shown in FIG. 6(c). As a result of this cutting action, a certain length of wire (called the "tail" of wire) 2a is left below the tip of the capillary 3 so that a ball is formed at the end of the tail 2a in the next step.

The length of the tail 2a often affects the size and quality of the ball; accordingly, the tail length is extremely important in wire bonding. A wire cutting method of this type is described in Japanese Patent Application Publication ("Kokoku") No. 62-52948.

In this prior art, the wire cutting clamp 4 is moved up very fast while it cuts the wire. As a result, the timing of cutting the wires differs as shown by T1 in which the wire cutting clamp 4 is closed, and such a difference T1 causes a variance of S1 in the length S of the tail 2a as shown in FIGS. 5(a) and 5(c). Thus, tails of equal length are not always obtained. This variance in the tail length can be reduced if the moving speed at acceleration 5 is slowed down; however, this results in a long total wire cutting time.

SUMMARY OF THE INVENTION

Accordingly, the object of the present invention is to provide a wire bonding method and apparatus which reduces variance in the tail length of the bonding wires without increasing the total wire cutting time.

The method of the present invention is utilized in a wire cutting method in which the capillary and wire cutting clamp are raised after the bonding of a wire to a second bonding point is accomplished, and then the wire cutting clamp is closed during this ascending movement, and the object of the present invention is achieved by that the ascending movement of the capillary and wire cutting clamp is slowed or temporarily stopped when the wire cutting clamp is closed to cut the wire.

The apparatus of the present invention is utilized in a wire cutting apparatus that comprises a wire cutting clamp, a capillary through which a wire is passed, a clamp open-close driving circuit which opens and closes the wire cutting clamp, and a vertical driving circuit which raises and lowers the capillary and wire cutting clamp, and the object of the present application is accomplished by the use of a control circuit which outputs a signal for closing the wire cutting clamp and also outputs a signal that slows or temporarily stops the ascending movement of the capillary and wire cutting clamp when the wire cutting clamp is closed to cut the wire.

Since the capillary and the wire cutting clamp are both slowed or temporarily stopped during the closing motion of the wire cutting clamp, the variance in the tail length of the wire, that is caused by timing differences in the wire clamping actions of the wire cutting clamp, can be extremely small. In addition, the capillary and the wire cutting clamp can be moved at high speed at all times except when the wire cutting is performed (i.e., at the time when the wire cutting clamp is closed). Accordingly, the total time required for wire cutting can be greatly decreased.

BRIEF DESCRIPTION OF THE DRAWINGS

FIG. 1 illustrates one embodiment of the wire cutting method of the present invention wherein FIG. 1(a) is a graph showing the height of the capillary, FIG. 1(b) is a graph showing the speed of the capillary and wire cutting clamp, and FIG. 1(c) is a timing chart showing the timing of the closing action of the wire cutting clamp;

FIG. 2 illustrates another embodiment of the wire cutting method of the present invention, wherein FIG. 2(a) is a graph showing the height of the capillary, FIG. 2(b) is a graph showing the speed of the capillary and wire cutting clamp, and FIG. 2(c) is a timing chart showing the timing of the closing action of the wire cutting clamp;

FIG. 5 shows a conventional wire cutting process wherein

DETAILED DESCRIPTION OF THE INVENTION

One embodiment of the present invention will be described below with reference to the accompanying drawings.

Figure 4:
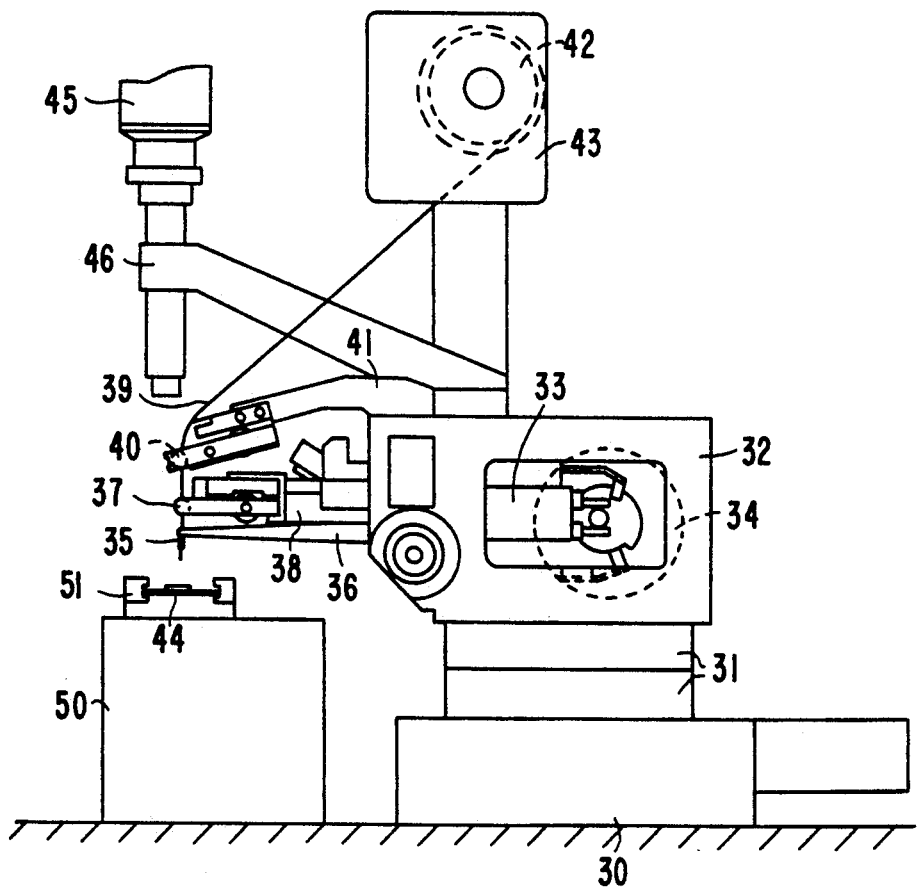
FIG. 4 is a side view of the wire bonding apparatus.
Figure 5A:
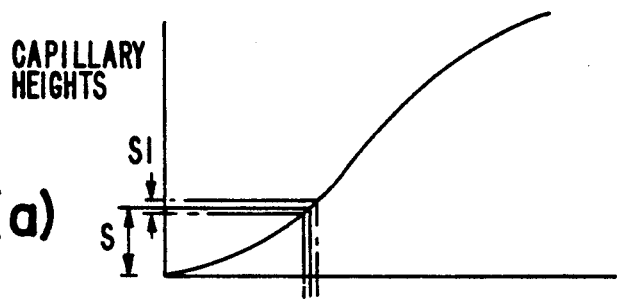
FIG. 5(a) is a graph which shows the height of the capillary.
Figure 5B:
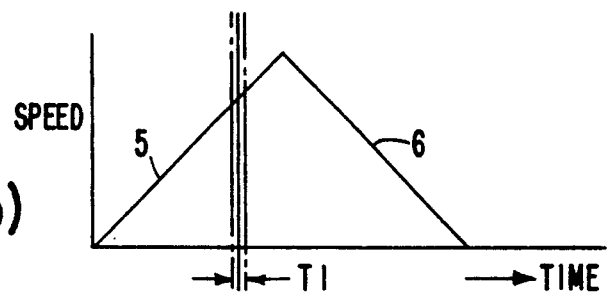
FIG. 5(b) is a graph which shows the speed of the capillary and wire cutting clamp.
Figure 5C:
FIG. 5(c) is a timing chart which shows the timing of the closing action of the wire cutting clamp.

FIG. 4 shows a wire bonding apparatus to which the present invention is applied.

An X-Y table 31 which is driven in the X and Y directions is mounted on a stand 30, and a bonding head 32 is fastened to this X-Y table 31. A lifter arm 33 is installed on the bonding head 32 so that the lifter arm 33 is raised and lowered via a motor 34.

A tool arm 36 having a capillary 35 at one end and a clamp support 38 holding a wire cutting clamp 37 are fastened to the lifter arm 33. In addition, a clamp support 41 which holds a wire holding clamp 40 that lightly clamps the wire 39, a spool support 43 which holds a spool 42 on which the wire 39 is bound, and a camera support 46 which holds a camera 45 that detects the sample 44, are all provided on the bonding head 32. The wire 39 passes through the capillary 35 via the wire holding clamp 40 and the wire cutting clamp 37 from the spool 42. In this figure, the numeral 50 is a feeder which feeds the sample 44, and 51 refers to guide rails which guide the sample 44.

Figure 6A:
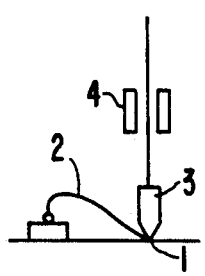
FIGS. 6(a), 6(b) and 6(c) are explanatory diagrams which illustrate the wire cutting action after the bonding to a second bonding point is completed.
Figure 6B:
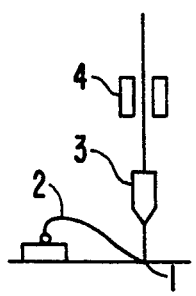

An embodiment of the wire cutting method of the present invention will be described according to FIG. 1 with reference to FIG. 6.

After bonding the wire to a second bonding point 1, the capillary 3 and the wire cutting clamp 4 are raised at a speed shown in FIG. 1(b).

First the capillary 3 and the wire cutting clamp 4 are raised at an increasing speed as referred to by numeral 10, and then the capillary 3 and the clamp 4 are raised at a decreasing (slower) speed as referred to by numeral 11 and further raised at a constant low speed as referred to by numeral 12. During this low speed ascending movement 12, a tail of a desired length is obtained on the wire.

More specifically, the start of the constant low speed interval 12 is set so that it is slightly below the desired tail length and the wire cutting clamp 4 is closed to cut the wire during this constant low speed interval 12.

Figure 6C:
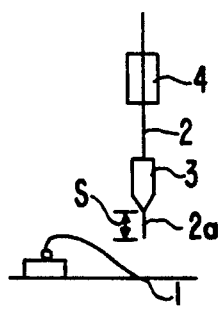

Afterward, the capillary 3 and the wire cutting clamp 4 are again raised at an increasing (faster) speed as referred to by numeral 13 and then again at a decreasing (slower) speed as referred to by numeral 14. Accordingly, the wire 2 can be cut in the same manner as shown in FIG. 6(c), and the tails 2a of desired lengths can be left below the tip of the capillary 3.

Since the wire cutting clamp 4 is thus closed during a constant low speed interval 12, variances in the length of the tails caused by the differences T1 in the timing of wire clamping action of the wire cutting clamp 4 can be extremely small. In addition, since the moving-up speed is lowered only when the wire clamping (or cutting) action of the wire cutting clamp 4 is made, the speed at other times, which are in the acceleration 10, in the deceleration 11, in the acceleration 13 and in the deceleration 14, can be extremely high. As a result, the total time required for wire cutting can be short.

FIG. 2 illustrates another embodiment of the wire cutting method of the present invention. In the embodiment described with reference to FIG. 1, the wire cutting clamp 4 is closed during the constant low speed interval 12. In this embodiment as shown in FIG. 2, on the other hand, the moving-up speed is reduced to zero. In other words, the movement to raise the capillary 3 and wire cutting clamp 4 is temporarily stopped as referred to by numeral 15 in FIG. 2(b), and the wire cutting clamp 4 is closed to cut the wire during this stop period 15. Thus, since the capillary 3 is raised to a desired tail length at the time of the stop period 15, there is no variance in the tail length even if there are differences T1 in the timing of the wire clamping action of the wire cutting clamp 4.

Figure 3:
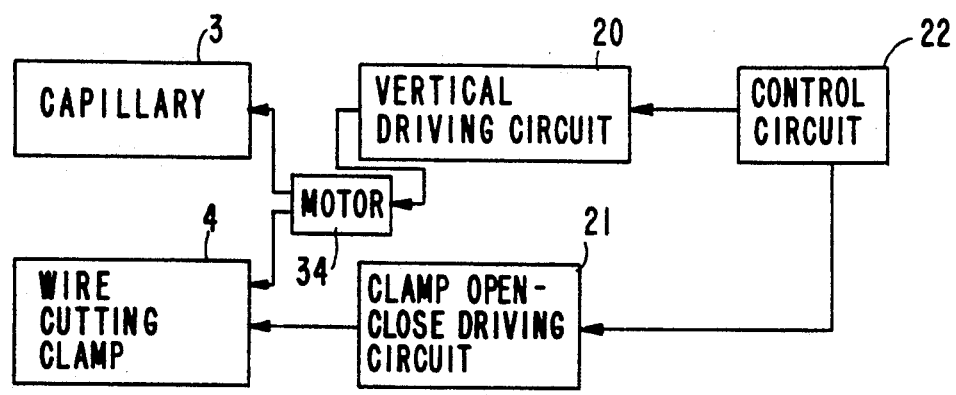
FIG. 3 is a block diagram representing one embodiment of the wire cutting apparatus of the present invention used in a wire bonding apparatus.

FIG. 3 represents one embodiment of the wire cutting apparatus of the present invention.

The capillary 3 and the wire cutting clamp 4 are raised and lowered by a vertical driving circuit 20 via a motor 34, and the wire cutting clamp 4 is opened and closed by a clamp open-close driving circuit 21. Signals which raise the capillary 3 and the wire cutting clamp 4 and signals which open and close the wire cutting clamp 4 are stored in and outputted from a control circuit 22 to the vertical driving circuit 20 and to the clamp open-close driving circuit 21 as shown in FIGS. 1 and 2. In other words, signals are outputted from the control circuit 22 when the ascending speed of the capillary 3 and wire cutting clamp 4 is slowed down at 12 or temporarily stopped at 15 and when the wire cutting clamp 4 is closed.

In the present invention, the capillary and the clamp are raised at a low speed or temporarily stopped when the wire cutting clamp is closed to cut the wire to form the tail; accordingly, the tail length can be constant without increasing the total wire cutting time.

We claim:

1. A wire bonding method in which a capillary and a wire cutting clamp are raised after a wire is bonded to a second bonding point, and a wire cutting clamp is closed during this ascending movement to cut said wire, said method being characterized in that an ascending movement of said capillary and wire cutting clamp is slowed to a predetermined slow speed when said wire cutting clamp is closed.

2. A wire bonding apparatus comprising:
a wire cutting clamp,
a capillary through which a wire passes,
a clamp open-close driving circuit which opens and closes said wire cutting clamp, and
a vertical driving circuit which raises and lower said capillary and wire cutting clamp,
said apparatus being characterized in that a control circuit is employed which outputs a signal for closing said wire cutting clamp and also outputs a signal that slows an ascending movement of said capillary and wire cutting clamp to a predetermined low speed when said wire cutting clamp is closed.

3. A wire bonding method comprising the steps of:
bonding a wire to a bonding point;
raising a capillary and a wire cutting clamp rapidly after said wire is bonded to said bonding point;
slowing the raising of said capillary and wire cutting clamp to a predetermined low speed;
closing said wire cutting clamp while said capillary and wire cutting clamp are slowed;
rapidly raising the capillary and wire cutting clamp after the wire has been clamped.

* * * * *